US009251999B2

(12) United States Patent
Dhindsa et al.

(10) Patent No.: US 9,251,999 B2
(45) Date of Patent: Feb. 2, 2016

(54) CAPACITIVELY-COUPLED PLASMA PROCESSING SYSTEM HAVING A PLASMA PROCESSING CHAMBER FOR PROCESSING A SUBSTRATE

(75) Inventors: Rajinder Dhindsa, Pleasanton, CA (US); Eric Hudson, Berkeley, CA (US); Alexei Marakhtanov, Albany, CA (US); Andreas Fischer, Castro Valley, CA (US)

(73) Assignee: Lam Research Corporation, Fremont, CA (US)

(*) Notice: Subject to any disclaimer, the term of this patent is extended or adjusted under 35 U.S.C. 154(b) by 847 days.

(21) Appl. No.: 13/526,391

(22) Filed: Jun. 18, 2012

(65) Prior Publication Data

US 2012/0312475 A1 Dec. 13, 2012

Related U.S. Application Data

(62) Division of application No. 11/618,563, filed on Dec. 29, 2006, now Pat. No. 8,222,156.

(51) Int. Cl.
*H01J 37/32* (2006.01)
*H01L 21/306* (2006.01)
(Continued)

(52) U.S. Cl.
CPC ..... *H01J 37/32174* (2013.01); *H01J 37/32091* (2013.01); *H01J 37/32128* (2013.01); *G03F 7/427* (2013.01); *H01J 37/32165* (2013.01); *H01J 37/32532* (2013.01); *H01L 21/306* (2013.01); *H01L 21/31138* (2013.01)

(58) Field of Classification Search
USPC ........... 156/345.24, 345.43–345.47; 118/715, 118/722, 723 R, 723 E; 315/111.21
See application file for complete search history.

(56) References Cited

U.S. PATENT DOCUMENTS 5,535,906 A 7/1996 Drummond ............... 216/67
5,575,887 A 11/1996 Yoshida et al. ......... 156/643.1
(Continued)

FOREIGN PATENT DOCUMENTS

EP 0875919 A2 11/1998 ........... H01J 37/32
EP 1 780 777 A1 2/2007 ........... H01L 21/3065
(Continued)

OTHER PUBLICATIONS

IPOS Search Report, Int. Property Office of Singapore, Examiner's Ref. IPOS/XRG, Apr. 2, 2014, App. No. 201109524-7, Lam Research Corp., pp. 1-3.

*Primary Examiner* — Maureen Passey
(74) *Attorney, Agent, or Firm* — Martine Penilla Group, LLP

(57) ABSTRACT

A capacitively-coupled plasma processing system having a plasma processing chamber for processing a substrate is provided. The plasma processing system includes at least an upper electrode and a lower electrode for processing the substrate, the substrate being disposed on the lower electrode during plasma processing. The plasma processing system further includes means for providing at least a first RF signal to the lower electrode, the first RF signal having a first RF frequency. The first RF signal couples with a plasma in the plasma processing chamber, thereby inducing an induced RF signal on the upper electrode. The plasma processing system further includes means for rectifying the induced RF signal to generate a rectified RF signal such that the rectified RF signal is more positively biased than negatively biased, wherein the substrate is configured to be processed while the rectified RF signal is provided to the upper electrode.

22 Claims, 5 Drawing Sheets

(51) Int. Cl.
*G03F 7/42* (2006.01)
*H01L 21/311* (2006.01)

(56) References Cited

U.S. PATENT DOCUMENTS

| | | | |
|---|---|---|---|
| 5,942,039 A | 8/1999 | Kholodenko et al. | 118/723 E |
| 5,981,899 A | 11/1999 | Perrin et al. | 219/121.52 |
| 6,383,931 B1 | 5/2002 | Flanner et al. | 438/689 |
| 6,464,794 B1 | 10/2002 | Park et al. | 118/728 |
| 6,797,109 B2 | 9/2004 | Park et al. | 156/345.37 |
| 7,740,737 B2 | 6/2010 | Koshiishi et al. | 156/345.44 |
| 7,951,262 B2 | 5/2011 | Koshiishi et al. | 156/345.44 |
| 7,988,816 B2 | 8/2011 | Koshiishi et al. | 156/345.47 |
| 8,056,503 B2 | 11/2011 | Kikuchi et al. | 118/723 E |
| 8,137,471 B2 | 3/2012 | Koshiishi et al. | 118/730 |
| 8,387,562 B2 | 3/2013 | Kikuchi et al. | 118/723 E |
| 2002/0022281 A1 | 2/2002 | Flanner et al. | 438/8 |
| 2003/0000459 A1 | 1/2003 | Park et al. | 117/200 |
| 2003/0000648 A1 | 1/2003 | Park et al. | 156/345.51 |
| 2003/0013315 A1 | 1/2003 | Park et al. | 438/710 |
| 2003/0045101 A1 | 3/2003 | Flanner et al. | 438/689 |
| 2004/0177927 A1 | 9/2004 | Kikuchi et al. | 156/345.51 |
| 2005/0088855 A1 | 4/2005 | Kirchmeier et al. | 363/17 |
| 2006/0037701 A1* | 2/2006 | Koshiishi et al. | 156/345.44 |
| 2006/0037703 A1 | 2/2006 | Koshiishi et al. | 156/345.47 |
| 2006/0066247 A1 | 3/2006 | Koshiishi et al. | 315/111.21 |
| 2006/0113037 A1 | 6/2006 | Nishio | 156/345.24 |
| 2006/0121704 A1 | 6/2006 | Walther et al. | 438/510 |
| 2010/0126668 A1 | 5/2010 | Koshiishi et al. | 156/345.47 |
| 2011/0214815 A1 | 9/2011 | Koshiishi et al. | 156/345.38 |
| 2011/0272097 A1 | 11/2011 | Koshiishi et al. | 156/345.24 |
| 2012/0006492 A1 | 1/2012 | Kikuchi et al. | 156/345.51 |
| 2012/0145324 A1 | 6/2012 | Koshiishi et al. | 156/345.29 |
| 2013/0174983 A1 | 7/2013 | Kikuchi et al. | 156/345.28 |

FOREIGN PATENT DOCUMENTS

| | | | | |
|---|---|---|---|---|
| JP | H07-254588 A | 10/1995 | | C23C 16/50 |
| JP | 2002506461 A | 2/2002 | | |
| JP | 200612488 | 4/2006 | | H01L 21/3065 |
| JP | 2006-270018 | 10/2006 | | |
| WO | WO 2006/063035 A2 | 6/2006 | | |

* cited by examiner

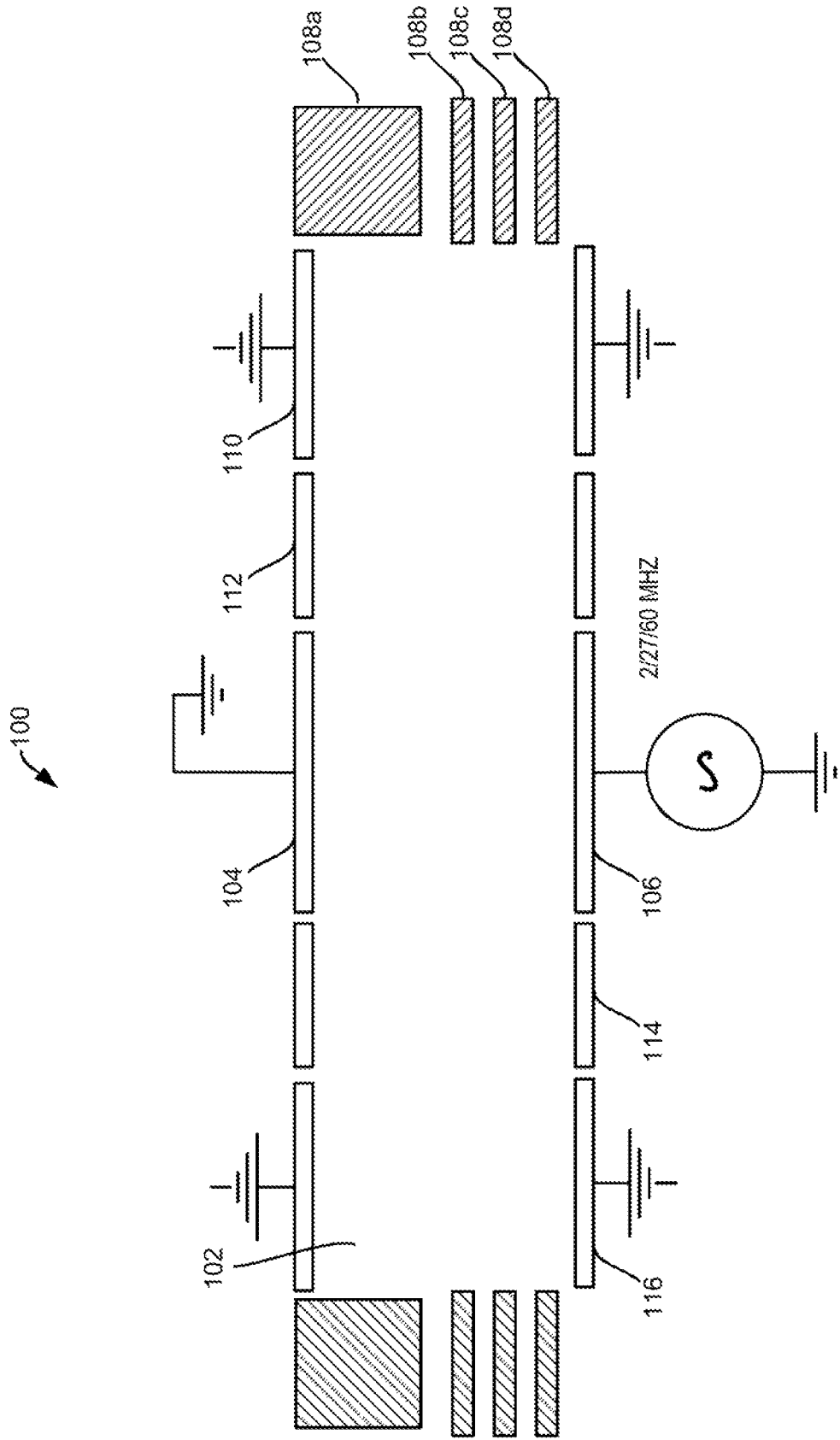
Fig. 1: Prior Art

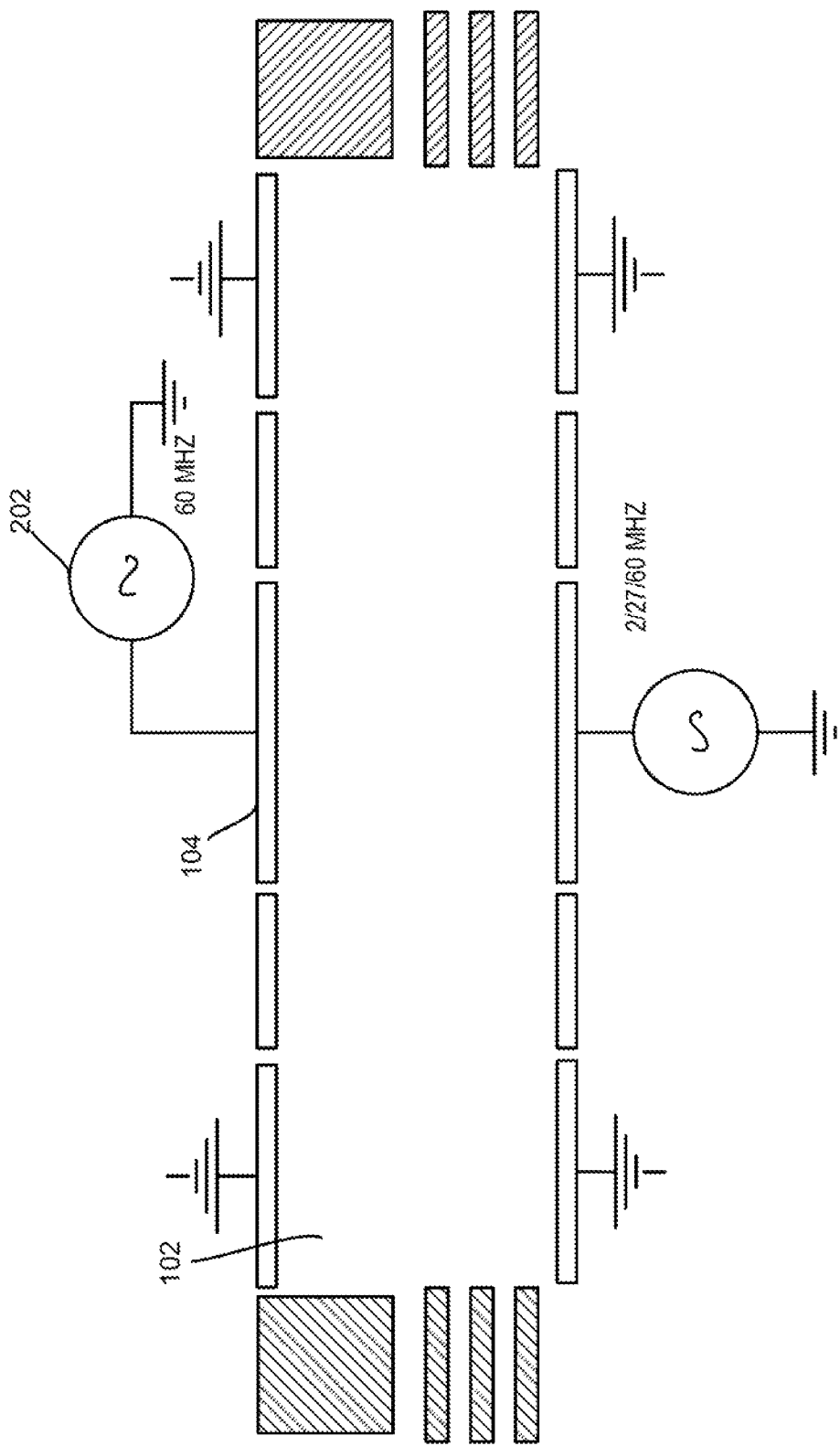
Fig. 2: Prior Art ably disposed on lower electrode 106 (substrate is
CAPACITIVELY-COUPLED PLASMA PROCESSING SYSTEM HAVING A PLASMA PROCESSING CHAMBER FOR PROCESSING A SUBSTRATE

PRIORITY CLAIM

This divisional application claims priority under 37 CFR 1.53(b) of and claims the benefit under 35 U.S.C. §120 to a commonly assigned patent application entitled "METHOD AND APPARATUS FOR PROCESSING A SUBSTRATE USING PLASMA", application Ser. No. 11/618,563 filed on Dec. 29, 2006, now U.S. Pat. No. 8,222,156.

CROSS REFERENCE TO RELATED APPLICATIONS

The present invention is related to the following applications, all of which are incorporated herein by reference:

Commonly assigned application entitled "Plasma-Enhanced Substrate Processing Method and Apparatus", filed on Dec. 29, 2009, having U.S. Pat. No. 8,262,847, issued on Sep. 11, 2012.

BACKGROUND OF THE INVENTION

In the processing of semiconductor substrates, plasma processing is often employed. Plasma processing may involve different plasma-generating technologies, for example, inductively-coupled plasma processing systems, capacitively-coupled plasma processing systems, microwave-generated plasma processing systems, and the like. Manufacturers often employ capacitively-coupled plasma processing systems in processes that involve the etching of materials using a photo resist mask.

Important consideration for plasma processing of substrates involves a high etch rate and a high photo resist selectivity. A high etch rate refers to the rate at which the target material is etched during plasma processing. Generally speaking, the faster the underlying layer may be etched, a greater number of wafers may be processed per unit of time. All things being equal, manufacturers desire to process more wafers per unit of time to increase wafer processing efficiency. Photo resist selectivity refers to the discrimination between the photo resist mask and the underlying target layer during etching.

As circuit density increases, manufacturers are required to etch or to form a greater number of devices per unit area on the wafer. The higher device density requires a thinner photo resist layer. The thinner photo resist layer, in turn, tends to be more susceptible to being inadvertently etched away. As a result, manufacturers constantly strive to create processing recipes that may etch the underlying layer at a high etch rate while avoiding damage to the photo resist mask.

One way to increase the etch rate is to increase the plasma density during plasma processing. In a capacitively-coupled plasma processing system, plasma density may be increased by increasing the power of the higher frequency RF signals. To facilitate discussion, FIG. 1 shows a prior art multi-frequency capacitively-coupled plasma processing system 100, representing the plasma processing system typically employed to process substrates. As seen in FIG. 1, multi-frequency capacitively-coupled plasma processing system 100 includes a chamber 102 which is disposed in between an upper electrode 104 and a lower electrode 106.

In the implementation of FIG. 1, lower electrode 106 is provided with multiple RF frequencies, such as 2 Megahertz, 27 Megahertz, and 60 Megahertz. Upper electrode 104 is grounded in the implementation of FIG. 1. Multi-frequency capacitively-coupled plasma processing system 100 also includes a plurality of confinement rings 108A, 108B, 108C, and 108D. The confinement rings 108A-108D function to confine the plasma within chamber 102 during plasma processing.

There is also shown in FIG. 1 a peripheral RF grounded ring 110, representing the RF ground for the plasma generated within chamber 102. To isolate peripheral RF ground 110 from upper electrode 104, an insulating ring 112 is typically provided. A similar insulating ring 114 is also provided to insulate lower electrode 106 from an RF ground 116. During plasma processing, the RF power provided to lower electrode 106 excites etching gas provided into chamber 102, thereby generating a plasma within chamber 102 to etch a substrate that is typically disposed on lower electrode 106 (substrate is not shown to simplify FIG. 1).

As discussed earlier, it is highly desirable to etch the target layer on the substrate while the substrate is disposed in chamber 102 without unduly damaging the overlying photo resist mask. In the prior art, increasing the etch rate of the target layer may be achieved by increasing the plasma density within chamber 102. Generally speaking, the plasma density may be increased by increasing the power level of the higher frequency RF signals that are provided to lower electrode 106. In the context of the present invention, a high frequency RF signal is defined as signals having a frequency higher than about 10 Megahertz. Conversely, RF signals with frequencies below 10 Megahertz are referred to herein as Low Frequency Signals.

However, by increasing the power level of the higher frequency RF signals (e.g., the 27 Megahertz RF signal or the 60 Megahertz RF signal of FIG. 1), it may be challenging to confine the generated plasma within chamber 102. Even if the plasma may be satisfactorily confined, electron loss to the upper electrode during plasma processing places an upper limit on the plasma density within chamber 102. It has been found that as the plasma density increases; electrons are lost to the grounded upper electrodes or other grounded surfaces of multi-frequency capacitively-coupled plasma processing system 100, thereby causing the plasma density within chamber 102 to reach a saturation point. Beyond the saturation point, increasing the RF power of the higher frequency RF signal does not increase the plasma density since the electron loss outpaces the generation of ions.

Furthermore, increasing the RF power to the higher frequency RF signals has been found to adversely affect the photo resist selectivity. At a high RF power level, the photo resist mask is damaged to a greater extent due to increased bombardment, which causes the photo resist mask to erode away at a faster rate, thereby negatively impacting the etching process.

FIG. 2 shows a prior art implementation whereby one or more high frequency RF signals 202 (e.g., the 60 Megahertz RF signal of FIG. 2) are provided to upper electrode 104 in order to provide additional control over the generation of ions within chamber 102. However, the implementation of FIG. 2 still does not solve the aforementioned problem of plasma density saturation point effect. When the RF power level of the higher frequency signal provided to upper electrode 104 is increased, the aforementioned saturation point effect is also observed, limiting the plasma density and consequently, the etch rate through the target layer irrespective of the increase in the RF power level to the higher frequency RF signals.

Additionally, other prior art implementation has tried to control the photo resist selectivity by controlling the temperature of the electrodes. It has been found that the approach of controlling the temperature of the electrodes is minimally effective in controlling the photo resist selectivity. Furthermore, the approach of controlling the temperature of the electrodes does not address the aforementioned problem of plasma density saturation point effect.

Therefore, various aforementioned prior art implementations have proven ineffective in increasing etch rate without adversely affecting or maintaining high photo resist selectivity in capacitively-coupled plasma processing system in processes that involve the etching of materials using a photo resist mask. In the prior art implementation of FIG. 1, the increase in RF power to the lower electrode may lead to unconfinement of plasma, saturation point of plasma density, and adversely affect the photo resist selectivity. Whereas in the prior art implementation of FIG. 2, the increase in RF power to the upper electrode may lead to saturation point of plasma density. Furthermore, the prior art implementation of controlling temperature of the electrodes is minimally effective in controlling the photo resist selectivity while providing no solution for the plasma density saturation effect.

SUMMARY OF INVENTION

The invention relates, in an embodiment, to a method for processing a substrate in a capacitively-coupled plasma processing system, which has a plasma processing chamber and at least an upper electrode and a lower electrode. The substrate is disposed on the lower electrode during plasma processing. The method includes providing at least a first RF signal to the lower electrode. The first RF signal has a first RF frequency. The first RF signal couples with a plasma in the plasma processing chamber, thereby inducing an induced RF signal on the upper electrode. The method also includes rectifying the induced RF signal to generate a rectified RF signal such that the rectified RF signal is more positively biased than negatively biased. The method further includes processing the substrate while the rectified RF signal is provided to the upper electrode.

The above summary relates to only one of the many embodiments of the invention disclosed herein and is not intended to limit the scope of the invention, which is set forth in the claims herein. These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which:

FIG. 1 shows a prior art multi-frequency capacitively-coupled plasma processing system representing the plasma processing system typically employed to process substrates.

FIG. 2 shows a prior art implementation whereby one or more high frequency RF signals are provided to upper electrode in order to provide additional control over the generation of ions within chamber.

DETAILED DESCRIPTION OF EMBODIMENTS

Figure 3A:
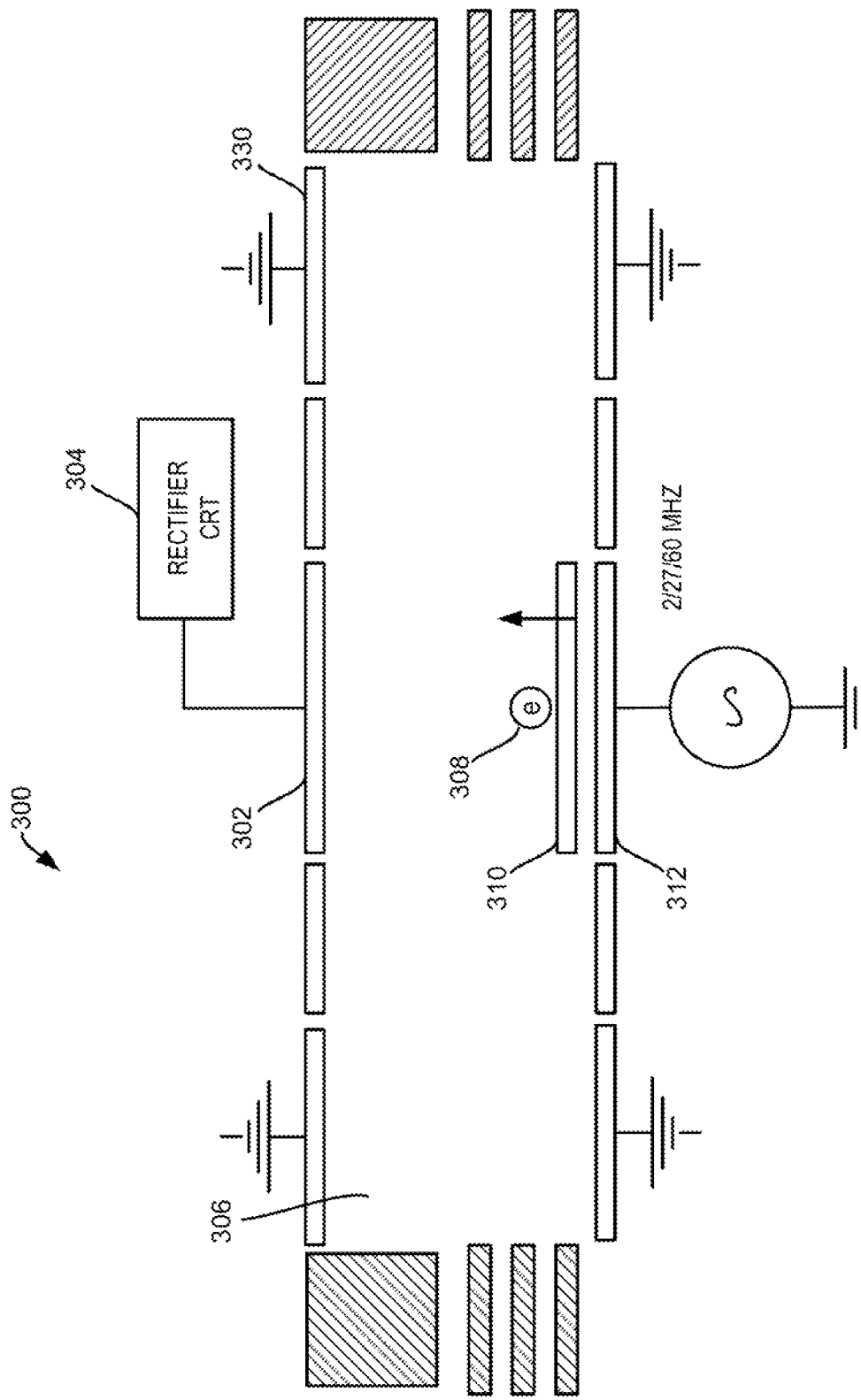
FIG. 3a shows an implementation wherein a rectifier circuit is employed to rectify the induced voltage that exists on upper electrode during plasma processing.

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Various embodiments are described hereinbelow, including methods and techniques. It should be kept in mind that the invention might also cover articles of manufacture that includes a computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out tasks pertaining to embodiments of the invention. Examples of such apparatus include a general-purpose computer and/or a dedicated computing device when appropriately programmed and may include a combination of a computer/computing device and dedicated/programmable circuits adapted for the various tasks pertaining to embodiments of the invention.

In accordance with embodiments of the invention, there are provided methods and arrangements for controlling the electron loss to the upper electrode such that the plasma density may be increased without the need to unduly increase the power to the plasma. By increasing the plasma density without a concomitant increase to the RF power requirement, the target layer may be etched at a higher rate without unduly degrading the photo resist selectivity. In an embodiment, the upper electrode is configured such that the upper electrode is negatively biased, thereby allowing electrons present in the plasma chamber to be repelled from the upper electrode and trapped within the plasma chamber for a longer period of time. As the negatively charged electrons are trapped for a longer period of time, the plasma density is increased.

Generally speaking, during plasma processing the bombardment mechanism causes electrons to be emitted from the substrate. As discussed earlier, electron loss to the upper electrode limits the increase in plasma density since the electron loss creates saturation point effect which limits the plasma density increase irrespective of the RF power provided to the plasma. In an embodiment, the induced RF signal on the upper electrode is rectified, thus biasing the upper electrode more negatively. Accordingly, the electrons are repelled from the upper electrode instead of being quickly lost to the upper electrode, resulting in a greater number of electrons in the plasma, thereby increasing the plasma density. In another embodiment, the rectified RF signal is amplified, thus driving the upper electrode even more negatively. The higher plasma density may effectively etch more of the target layer to achieve the desired high etch rate. Since it is unnecessary to increase the RF power to achieve the high level of plasma density, photo resist selectivity is not adversely affected to the same degree as might have been in the prior art.

The above summary relates to only one of the many embodiments of the invention disclosed herein and is not intended to limit the scope of the invention, which is set forth in the claims herein. These and other features of the present invention will be described in more detail below in the detailed description of the invention and in conjunction with the following figures.

FIG. 3A shows, in accordance with an embodiment of the present invention, an implementation wherein a rectifier circuit 304 is employed to rectify the induced voltage that exists on upper electrode 302 during plasma processing. As the term is employed herein, rectification refers to the process of reducing or eliminating the positive cycle of the RF signal that exists on upper electrode 302.

Figure 3B:
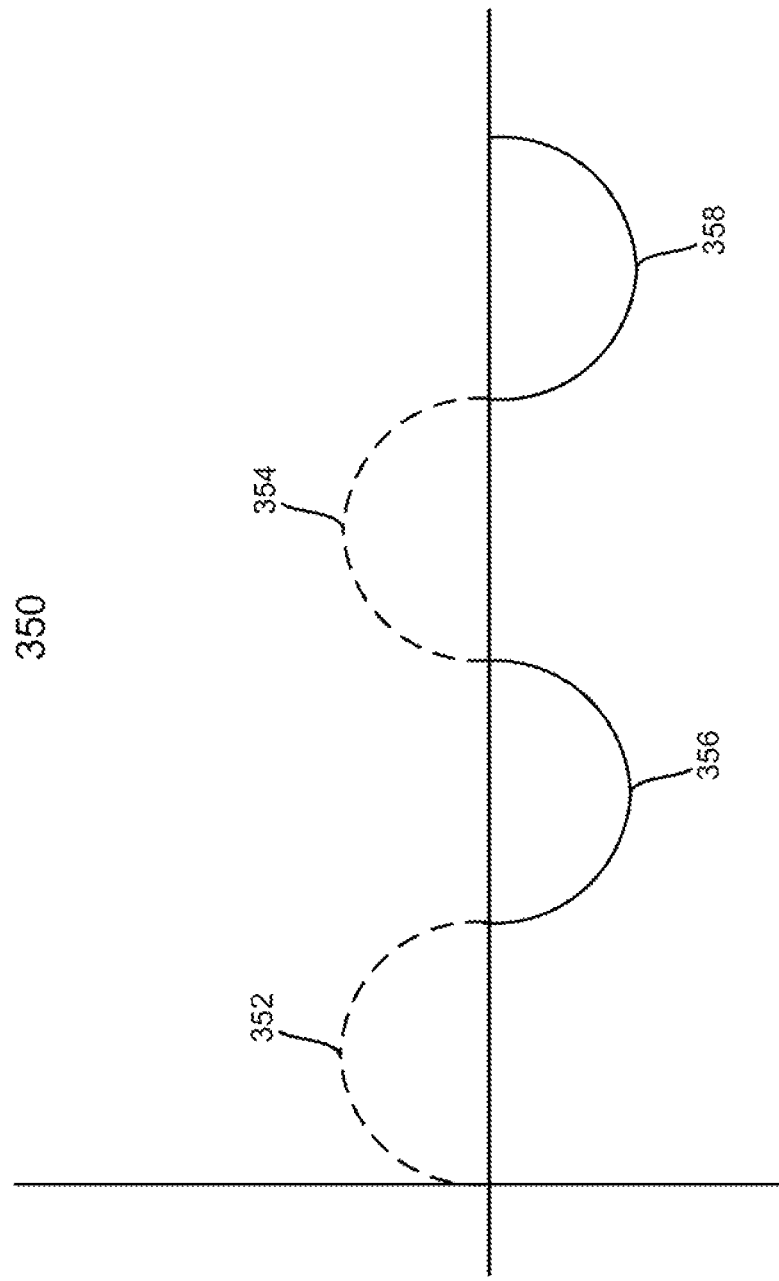
FIG. 3b shows an example RF signal.

With reference to FIG. 3B, an example RF signal 350 is shown. The dotted portion 352 and 354 of the RF signal 350 have been rectified away, leaving solid line 356 and 358, representing the negative portion of the RF signal. Since only the negative portion of the RF signal remains, the upper electrode 302 tends to be more negatively biased with respect to the plasma that exists within plasma chamber 306.

In accordance with an embodiment of the present invention, electrons 308 that are emitted from substrate 310 disposed atop lower electrode 312 accelerate away from substrate 310 due to ion bombardment across the substrate sheath or the lower sheath (lower sheath is not shown to simplify FIG. 3A). Instead of being immediately lost to upper electrode 302 (as would be the case if upper electrode 302 is grounded, for example) the negatively biased upper electrode 302 would repel electrons 308, thereby causing electrons 308 to be trapped in between upper electrode 302 and lower electrode 312 for a longer period of time. It is believed that eventually, through the mechanism of random collision, electrons 308 are eventually lost to RF ground 330. However, the longer residence time of electrons 308 within plasma chamber 306 contributes to a higher plasma density without requiring a corresponding increase in the amount of RF power supplied to plasma processing chamber 300.

Generally speaking, rectifier 304 may be constructed using any known rectification circuitry, including, for example, power MOSFET. In an embodiment, rectifier circuit 304 further includes an amplification circuit to not only eliminate the positive cycle of the RF signal but also to amplify or to reduce the amplitude of the negative portion of the RF cycle that remains. The ability to control the amplitude of the negative portion of the RF signal that remains provides another control knob for the process engineer during processing.

For example, it is known that lower energy electrons and higher energy electrons impact the etch process in different ways. Trapping the lower energy electron requires, in an embodiment, that the upper electrode 302 to be negatively biased to at least negative 100 volt. Trapping higher energy electrons requires, in an embodiment, that the upper electrode be negatively biased to a higher negative value such as negative 500 volt or negative 600 volt or more. Since a high density of higher energy electrons is believed to be beneficial for photo resist selectivity, manufacturers may desire in many cases to negatively bias upper electrode 302 to cause more of the higher energy electrons to be trapped.

Figure 4B:
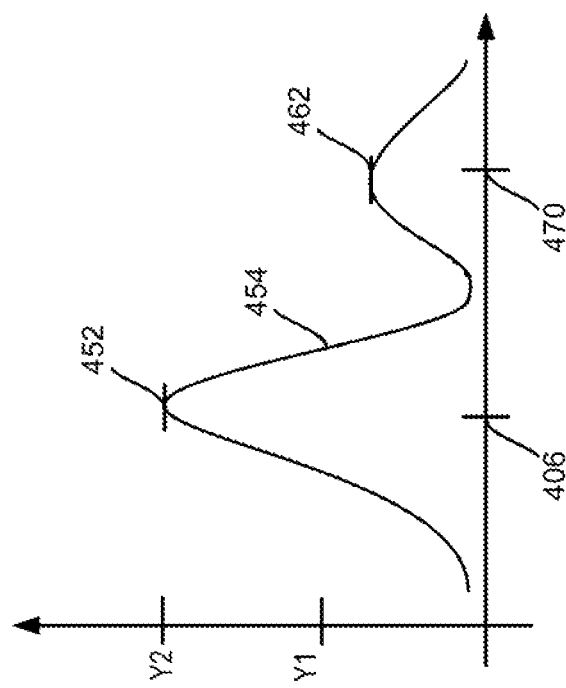
FIG. 4b shows an example plot of electron density for electrons having various electron energy levels when rectification circuit is provided to trap more electrons within plasma chamber during plasma processing.
Figure 4A:
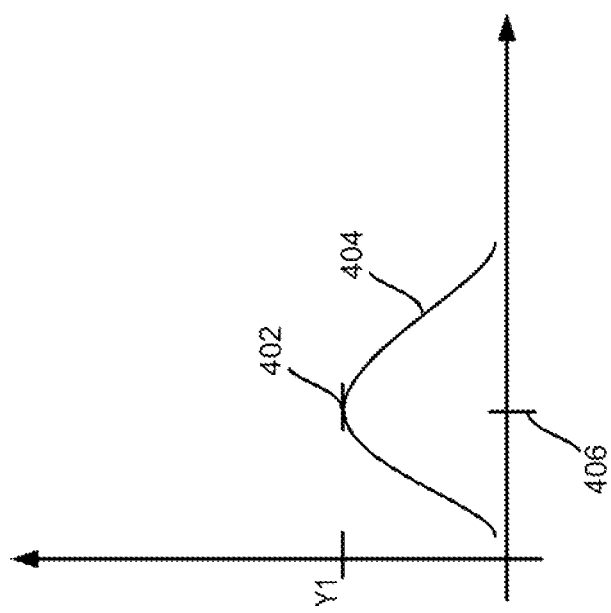
FIG. 4a shows an example plot of electron density on the y-axis versus electron energy on the x-axis for a hypothetical plasma etch process.

FIG. 4A shows an example plot of electron density on the y-axis versus electron energy on the x-axis for a hypothetical plasma etch process. In the typical prior art case, the electron loss mechanism to the grounded upper electrode or to the upper electrode that is supplied with the higher frequency RF signal as in the case of FIG. 2, limit the plasma density that may be achieved using a given level of RF power.

In the case of FIG. 4A, the area under curve 404 represents the distribution of electrons at different energy level. The local maxima 402 of the curve 404 represent the maximum electron density at the density level Y1 of electrons having energy level 406. Notice that distribution of electrons having a higher electron energy level (such as those to the right of point 406 in FIG. 4A) do not exist at a high density level in the plasma chamber 306 during plasma processing. FIG. 4B shows an example plot of electron density for electrons having various electron energy levels when rectification circuit 304 is provided to trap more electrons within plasma chamber 306 during plasma processing.

In contrast to FIG. 4A, the electron density of the lower energy electron, e.g., those having electron density denoted by reference number 406 now increases from electron density level Y1 to a higher electron density level Y2, corresponding to maxima 452 of line 454. Further, by biasing upper electrode 302 more negatively, a greater number of higher energy electrons may be trapped.

The higher energy electrons is shown in FIG. 4B by another local maxima 462 which corresponds to the maximum electron density captured or trapped for electrons having electron energy level that corresponds to reference number 470. In the scenario of local maxima 462, not only do the lower electrons (those associated with reference 406) exist in the chamber at a higher density level but the higher energy electrons (those associated with reference number 470) also exist at a higher electron density level within the plasma processing chamber during plasma processing. These higher electron density levels contribute to a higher plasma density during plasma processing to improve the etch rate to the target layer. Note that the mechanism to increase the plasma density of FIG. 3A does not require the increase in the RF power supplied to the RF signals (such as the 2 Megahertz RF signal, the 27 Megahertz RF signal, or the 60 Megahertz RF signal in the example of FIG. 3A). Consequently, the photo resist selectivity is not negatively impacted to the same degree that would have been impacted had the higher plasma density been achieved by increasing the RF power level.

As may be appreciated from the foregoing, embodiments of the invention achieve a higher level of plasma density to improve etching through the target layer in the capacitively-coupled plasma processing chamber without unduly damaging the photo resist during etching. By providing a mechanism for increasing the plasma density without requiring a concomitant increase in the RF power level of the RF signals provided to the plasma processing chamber, plasma density is increased while photo resist selectivity is maintained the same or is minimally impacted.

While this invention has been described in terms of several preferred embodiments, there are alterations, permutations, and equivalents, which fall within the scope of this invention. Also, the title, summary, and abstract are provided herein for convenience and should not be used to construe the scope of the claims herein. It should also be noted that there are many alternative ways of implementing the methods and apparatuses of the present invention. Although various examples are provided herein, it is intended that these examples be illustrative and not limiting with respect to the invention. It is therefore intended that the following appended claims be interpreted as including all such alterations, permutations, and equivalents as fall within the true spirit and scope of the present invention.

What is claimed is:

1. A capacitively-coupled plasma processing system having a plasma processing chamber for processing a substrate, comprising:
   at least an upper electrode and a lower electrode for processing said substrate, said substrate being disposed on said lower electrode during plasma processing;
   a generator for providing at least a first RF signal to said lower electrode, said first RF signal having a first RF frequency, said first RF signal coupling with a plasma in said plasma processing chamber, thereby inducing an induced RF signal on said upper electrode;
   a rectifying arrangement for rectifying said induced RF signal to generate a rectified RF signal such that said rectified RF signal is more negatively biased than positively biased,
   wherein said substrate is configured to be processed while said rectified RF signal is provided to said upper electrode.

2. The capacitively-coupled plasma processing system of claim 1 wherein said rectifying includes removing positive components of said induced RF signal.

3. The capacitively-coupled plasma processing system of claim 1 further comprising the generator providing a second RF signal to said lower electrode, said second RF signal having a second RF frequency different from said first RF signal.

4. The capacitively-coupled plasma processing system of claim 3 wherein said second RF frequency is one of 2 MHz, 27 MHz and 60 MHz.

5. The capacitively-coupled plasma processing system of claim 1 wherein said rectifying further including amplifying an amplitude of said induced RF signal to generate said rectified RF signal.

6. The capacitively-coupled plasma processing system of claim 1 wherein said capacitively-coupled plasma processing system represents a multi-frequency capacitively-coupled plasma processing system.

7. The capacitively-coupled plasma processing system of claim 1 wherein said rectifying said induced RF signal to generate said rectified RF signal is performed using said rectifying arrangement.

8. The capacitively-coupled plasma processing system of claim 7 wherein said rectifying arrangement includes a power MOSFET.

9. A capacitively-coupled plasma processing system having a plasma processing chamber for processing a substrate, comprising:
   at least an upper electrode and a lower electrode for processing said substrate, said substrate being disposed on said lower electrode during plasma processing;
   a generator for providing a plurality of RF signals to said lower electrode, a first RF signal of said plurality of RF signals having a first RF frequency, said first RF signal coupling with a plasma in said plasma processing chamber, thereby inducing an induced RF signal on said upper electrode;
   a rectifying arrangement coupled to said induced RF signal to generate a rectified RF signal such that said rectified RF signal is more negatively biased than positively biased; and
   wherein said substrate is configured to be processed while said rectified RF signal is provided to said upper electrode.

10. The capacitively-coupled plasma processing system of claim 9 wherein said rectifying arrangement includes circuitry configured to remove positive components of said induced RF signal.

11. The capacitively-coupled plasma processing system of claim 9 wherein said rectifying arrangement further includes circuitry configured to amplify an amplitude of said induced RF signal to generate said rectified RF signal.

12. A plasma processing system for processing a substrate and having a plasma processing chamber, comprising:
   an upper electrode;
   a lower electrode, said substrate being disposed on said lower electrode during plasma processing;
   a generator for providing at least a first RF signal to said lower electrode, said first RF signal having a first RF frequency, said first RF signal coupling with a plasma in said plasma processing chamber, thereby inducing an induced RF signal on said upper electrode; and
   a rectifying arrangement for reducing or eliminating at least a positive cycle of said induced RF signal to generate a rectified RF signal such that said rectified RF signal is more negatively biased with respect to said plasma, wherein said substrate is processed while said rectified RF signal is provided to said upper electrode.

13. The plasma processing system of claim 12 further comprising the generator providing a second RF signal to said lower electrode, said second RF signal having a second RF frequency different from said first RF signal.

14. The plasma processing system of claim 13 wherein said second RF frequency is one of 2 MHz, 27 MHz and 60 MHz.

15. The plasma processing system of claim 12 further comprising an amplifier for amplifying an amplitude of said induced RF signal to generate said rectified RF signal.

16. The plasma processing system of claim 12 wherein said capacitively-coupled plasma processing system represents a multi-frequency capacitively-coupled plasma processing system.

17. The plasma processing system of claim 12 wherein said rectifying arrangement includes a power MOSFET.

18. The plasma processing system of claim 12 further comprising an amplifier for amplifying an amplitude of a negative portion of said induced RF signal to generate said rectified RF signal.

19. The plasma processing system of claim 12 wherein said rectifying arrangement includes a rectifier circuit.

20. The plasma processing system of claim 19 wherein said rectifier circuit includes an amplification circuit for amplifying an amplitude of a negative portion of said induced RF signal.

21. The plasma processing system of claim 19 wherein said rectifier circuit is coupled with said upper electrode.

22. The plasma processing system of claim 19 wherein said rectifier circuit is disposed outside said plasma processing chamber.

* * * * *